(12) United States Patent
Lee et al.

(10) Patent No.: US 10,310,340 B2
(45) Date of Patent: Jun. 4, 2019

(54) LIQUID CRYSTAL DISPLAY DEVICE AND MANUFACTURING METHOD THEREOF

(71) Applicant: Samsung Display Co., Ltd., Yongin-si, Gyeonggi-do (KR)

(72) Inventors: Keum Hee Lee, Goyang-si (KR); Man Jin Kim, Seoul (KR); Yu Jun Kim, Asan-si (KR); Chang Yeol Lee, Suwon-si (KR); Su Jung Jung, Yongin-si (KR); Ji Young Jeong, Cheonan-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 15/398,554

(22) Filed: Jan. 4, 2017

(65) Prior Publication Data

US 2017/0205656 A1    Jul. 20, 2017

(30) Foreign Application Priority Data

Jan. 20, 2016 (KR) .......................... 10-2016-0007154

(51) Int. Cl.
*G02F 1/1345* (2006.01)
*G02F 1/1343* (2006.01)
(Continued)

(52) U.S. Cl.
CPC ...... *G02F 1/13439* (2013.01); *G02F 1/13452* (2013.01); *G02F 1/136286* (2013.01);
(Continued)

(58) Field of Classification Search
CPC ............... H01L 27/1214; H01L 27/124; H01L 27/3244; H01L 27/3248; H01L 29/4908;
(Continued)

(56) References Cited

U.S. PATENT DOCUMENTS

| 7,259,035 B2 * | 8/2007 | Kim ................... G02F 1/13458 257/E21.414 |
| 9,048,326 B2 | 6/2015 | Choi et al. |
| 2002/0003587 A1 * | 1/2002 | Tsujimura ............. G02F 1/1368 349/42 |
| 2003/0037843 A1 * | 2/2003 | Hishida ..................... C23C 8/10 148/284 |

(Continued)

FOREIGN PATENT DOCUMENTS

| KR | 10-2008-0002202 A | 1/2008 |
| KR | 20080002202 | * 4/2008 ........... G02F 1/1335 |

(Continued)

*Primary Examiner* — Galina G Yushina
(74) *Attorney, Agent, or Firm* — Innovation Counsel LLP

(57) ABSTRACT

A Liquid crystal display device and manufacturing method thereof are provided. According to an exemplary embodiment of the present disclosure, an LCD device includes: a first substrate including a display area and a non-display area disposed outside of the display area; a gate electrode disposed on the first substrate and including a first-layer gate electrode and a second-layer gate electrode disposed on the first-layer gate electrode; a pixel electrode disposed on the same layer as the first-layer gate electrode; a source electrode and a drain electrode disposed on the gate electrode to be spaced from each other; and a contact connecting the drain electrode and the pixel electrode and including a first-layer contact, which is disposed on the same layer as the pixel electrode, and a second-layer contact, which is disposed on the first-layer contact.

12 Claims, 15 Drawing Sheets

(51) Int. Cl.
*G02F 1/1362* (2006.01)
*G02F 1/1368* (2006.01)
*H01L 29/49* (2006.01)
*H01L 29/786* (2006.01)
*G02F 1/1333* (2006.01)

(52) U.S. Cl.
CPC ............ *G02F 1/1368* (2013.01); *G02F 2001/133388* (2013.01); *G02F 2001/136231* (2013.01); *G02F 2201/123* (2013.01); *G02F 2202/10* (2013.01); *H01L 29/4908* (2013.01); *H01L 29/7869* (2013.01); *H05K 2201/10128* (2013.01)

(58) Field of Classification Search
CPC ........... H01L 29/7869; H01L 29/78693; G02F 1/13439; G02F 1/136286; G02F 1/1368; G02F 1/13; G02F 2201/123; G02F 2001/13629
See application file for complete search history.

(56) References Cited

U.S. PATENT DOCUMENTS

| | | | | |
|---|---|---|---|---|
| 2004/0033648 | A1* | 2/2004 | Matsunaga | H01L 29/458 438/154 |
| 2004/0263754 | A1* | 12/2004 | Ahn | G02F 1/134363 349/141 |
| 2013/0228772 | A1* | 9/2013 | Choi | H01L 27/1225 257/43 |
| 2014/0176838 | A1* | 6/2014 | Hong | G02F 1/134363 349/33 |
| 2015/0070612 | A1* | 3/2015 | Seo | G02F 1/133514 349/43 |
| 2016/0190338 | A1* | 6/2016 | Tanaka | H01L 29/4234 257/43 |

FOREIGN PATENT DOCUMENTS

| | | |
|---|---|---|
| KR | 10-2009-0119521 A | 11/2009 |
| KR | 10-2013-0103206 A | 9/2013 |

* cited by examiner

LIQUID CRYSTAL DISPLAY DEVICE AND MANUFACTURING METHOD THEREOF

This application claims priority to Korean Patent Application No. 10-2016-0007154 filed on Jan. 20, 2016 in the Korean Intellectual Property Office, the disclosure of which is incorporated herein by reference in its entirety.

BACKGROUND

1. Field of the Invention

The present disclosure relates to a liquid crystal display (LCD) device and a manufacturing method thereof.

2. Description of the Related Art

The importance of display devices has steadily grown with recent developments in multimedia technology. As a result, a variety of display devices, such as a liquid crystal display (LCD) device, an organic light-emitting diode (OLED) device, and the like, have been developed and become widespread.

The LCD device, which is one of the most widely-used flat panel displays, includes two substrates on which field-generating electrodes, such as pixel electrodes and a common electrode, are formed and a liquid crystal layer interposed between the two substrates. The LCD device generates an electric field in the liquid crystal layer by applying a voltage to the field-generating electrodes and thus, displays an image by determining the orientation of liquid crystal molecules in the liquid crystal layer and controlling the polarization of incident light.

In the meantime, as the size and the resolution of the LCD device increases, the amount of wiring for sophisticatedly controlling the LCD device gradually increases. However, the larger the area occupied by such wiring is, the larger the area of a non-display area becomes, and the more difficult it becomes to realize a narrow-bezel display device. Against this backdrop, various attempts are being made to realize a narrow-bezel LCD device and develop ways to sophisticatedly control an LCD device.

SUMMARY

Exemplary embodiments of the present disclosure provide a liquid crystal display (LCD) device having a narrow bezel, which is obtained by reducing the area of wiring in a non-display area.

Exemplary embodiments of the present disclosure also provide a manufacturing method of an LCD device that reduces the number of mask processes required so as to reduce the overall manufacturing cost.

However, exemplary embodiments of the present disclosure are not restricted to those set forth herein. The above and other exemplary embodiments of the present disclosure will become more apparent to one of ordinary skill in the art to which the present disclosure pertains by referencing the detailed description of the present disclosure given below.

According to an exemplary embodiment of the present disclosure, an LCD device includes: a first substrate including a display area and a non-display area disposed outside of the display area; a gate electrode disposed on the first substrate and including a first-layer gate electrode and a second-layer gate electrode disposed on the first-layer gate electrode; a pixel electrode disposed on the same layer as the first-layer gate electrode; a source electrode and a drain electrode disposed on the gate electrode to be spaced from each other; and a contact connecting the drain electrode and the pixel electrode and including a first-layer contact, which is disposed on the same layer as the pixel electrode, and a second-layer contact, which is disposed on the first-layer contact.

The pixel electrode and the first-layer gate electrode may be formed of the same material.

The pixel electrode may comprise a metal having a polycrystalline structure.

The pixel electrode may be formed of polycrystalline indium tin oxide (ITO).

The first-layer gate electrode may be formed of amorphous ITO.

The first-layer contact may be formed in one body with the pixel electrode.

A first sidewall of the first-layer contact may be aligned with a first sidewall of the second-layer contact.

The first-layer contact and the second-layer contact may be formed of different materials.

The second-layer gate electrode and the second-layer contact may be formed of the same material.

The semiconductor pattern layer may comprise an oxide semiconductor.

The drain electrode may contact the second-layer contact, and a second sidewall of the drain electrode may be aligned with a second sidewall of the second-layer contact.

The LCD device may also include a data fan-out line disposed in the non-display area and including a first-layer data fan-out line and a second-layer data fan-out line disposed on the first-layer data fan-out line.

The LCD device may also include a data line connected to the source electrode and a data pad disposed at an end of the data line, wherein the data pad contacts the second-layer data fan-out line.

According to another exemplary embodiment of the present disclosure, an LCD device includes: a first substrate including a display area and a non-display area disposed outside of the display area; a gate electrode disposed on the first substrate and including a first-layer gate electrode and a second-layer gate electrode disposed on the first-layer gate electrode; a pixel electrode disposed on the same layer as the first-layer gate electrode; a source electrode and a drain electrode disposed on the gate electrode to be spaced from each other; a contact connecting the drain electrode and the pixel electrode and including a first-layer contact, which is disposed on the same layer as the pixel electrode, and a second-layer contact, which is disposed on the first-layer contact; and a second substrate facing the first substrate.

The LCD device may also include: a color filter disposed on the second substrate and overlapping the pixel electrode; and a black matrix overlapping the source electrode and the drain electrode.

The LCD device may also include a common electrode disposed on the color filter and the black matrix.

According to another exemplary embodiment of the present disclosure, a manufacturing method of an LCD device includes: preparing a first substrate, which includes a display area and a non-display area that is disposed on the outside of the display area and on which a first metal layer and a second metal layer are sequentially stacked; forming a gate electrode, which includes a first-layer gate electrode and a second-layer gate electrode, and a pixel pattern layer, which includes a first-layer pixel pattern layer and a second-layer pixel pattern layer, in the display area by patterning the first metal layer and the second metal layer; forming a gate insulating layer on the gate electrode and the pixel pattern layer; exposing the second-layer pixel pattern layer by patterning the gate insulating layer; forming a semiconductor pattern layer on the gate electrode; changing the crystalline structure of the first-layer pixel pattern layer by performing thermal treatment on a resultant structure; and forming a source electrode, a drain electrode, a pixel electrode, and a contact, which electrically connects the source electrode, the drain electrode, and the pixel electrode, by forming a third metal layer on the resultant structure and etching both the second-layer pixel pattern layer and the third metal layer using a single mask.

The forming the gate electrode, which includes the first-layer gate electrode and the second-layer gate electrode, and the pixel pattern layer, which includes the first-layer pixel pattern layer and the second-layer pixel pattern layer, in the display area by patterning the first metal layer and the second metal layer, may include forming a data fan-out line, which includes a first-layer data fan-out line and a second-layer data fan-out line, in the non-display area by patterning the first metal layer and the second metal layer.

The exposing the second-layer pixel pattern layer by patterning the gate insulating layer, may include exposing the second-layer data fan-out line in the non-display area by patterning the gate insulating layer.

The forming the source electrode, the drain electrode, the pixel electrode, and the contact, which electrically connects the source electrode, the drain electrode, and the pixel electrode, by forming the third metal layer on the resultant structure and etching both the second-layer pixel pattern layer and the third metal layer using a single mask, may include forming a data pad, which contacts the second-layer data fan-out line, in the non-display area by etching both the second-layer pixel pattern layer and the third metal layer using a single mask.

The first-layer pixel pattern layer may be formed of amorphous ITO, and the changing the crystalline structure of the first-layer pixel pattern layer, may include transforming the amorphous ITO of the first-layer pixel pattern layer into polycrystalline ITO.

According to the exemplary embodiments, an LCD device having a narrow bezel may be provided.

In addition, the manufacturing cost of an LCD device may be reduced by reducing the number of masks required.

Other features and aspects will be apparent from the following detailed description, the drawings, and the claims.

DETAILED DESCRIPTION OF THE EMBODIMENTS

Figure 1:
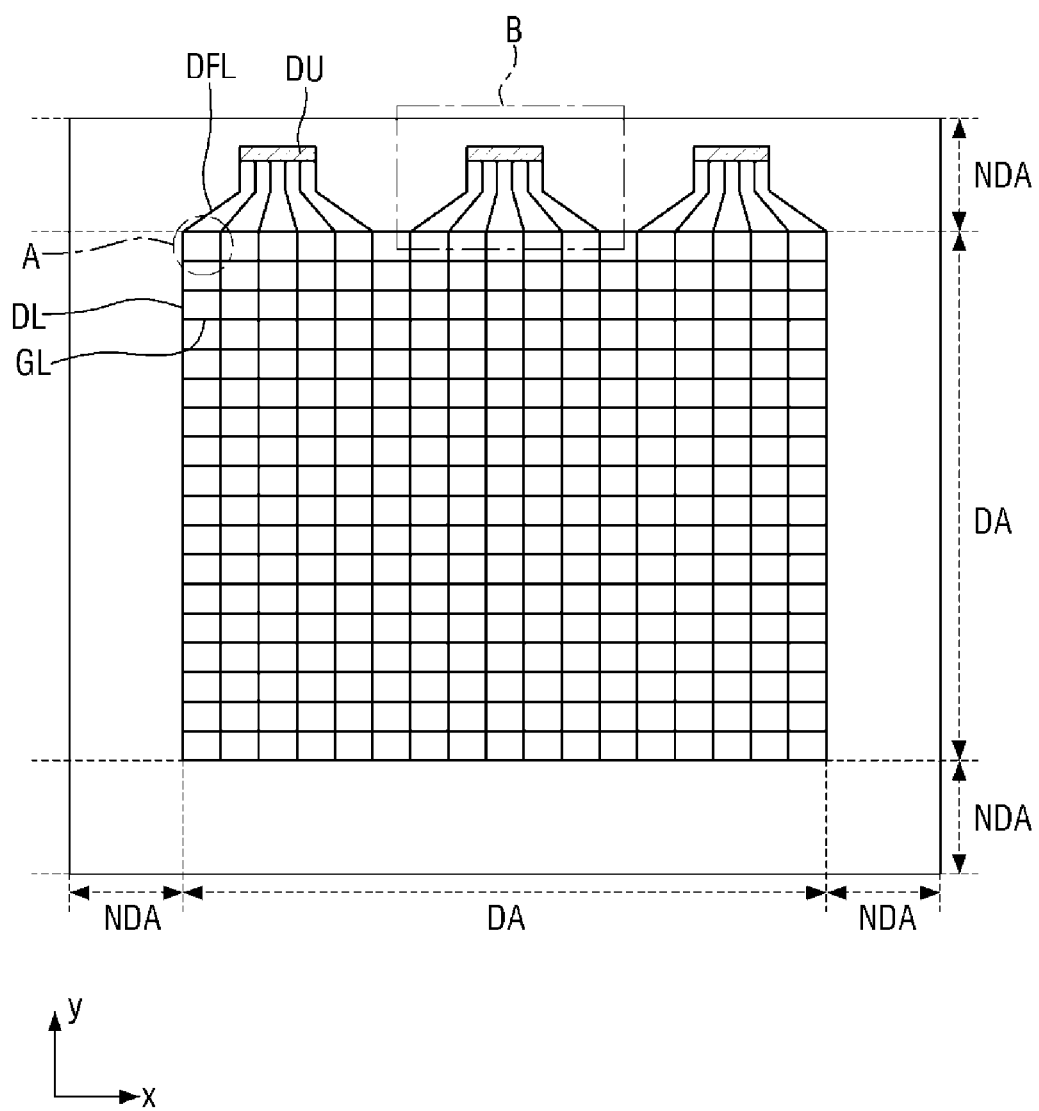
FIG. 1 is a layout view of a liquid crystal display (LCD) device according to an exemplary embodiment of the present disclosure.

The aspects and features of the present invention and methods for achieving the aspects and features will be apparent by referring to the embodiments described herein in detail with reference to the accompanying drawings. However, the present invention is not limited to the embodiments disclosed hereinafter and may be implemented in diverse forms. The matters defined in the description, such as the detailed construction and elements, are merely provided to assist those of ordinary skill in the art in a comprehensive understanding of the invention, and the present invention is only defined within the scope of the appended claims.

The term "on" that is used to designate that an element is on another element or located on a different layer or a layer includes both a case in which an element is located directly on another element or a layer and a case in which an element is located on another element via another layer or still another element. In the entire description of the present invention, the same drawing reference numerals are used for the same elements across various figures. Although the terms "first, second, and so forth" are used to describe diverse constituent elements, such constituent elements are not limited by the terms. The terms are used only to distinguish a constituent element from other constituent elements. Accordingly, in the following description, a first constituent element may be a second constituent element. Hereinafter, embodiments of the present invention are described with reference to the attached drawings.

Figure 2:
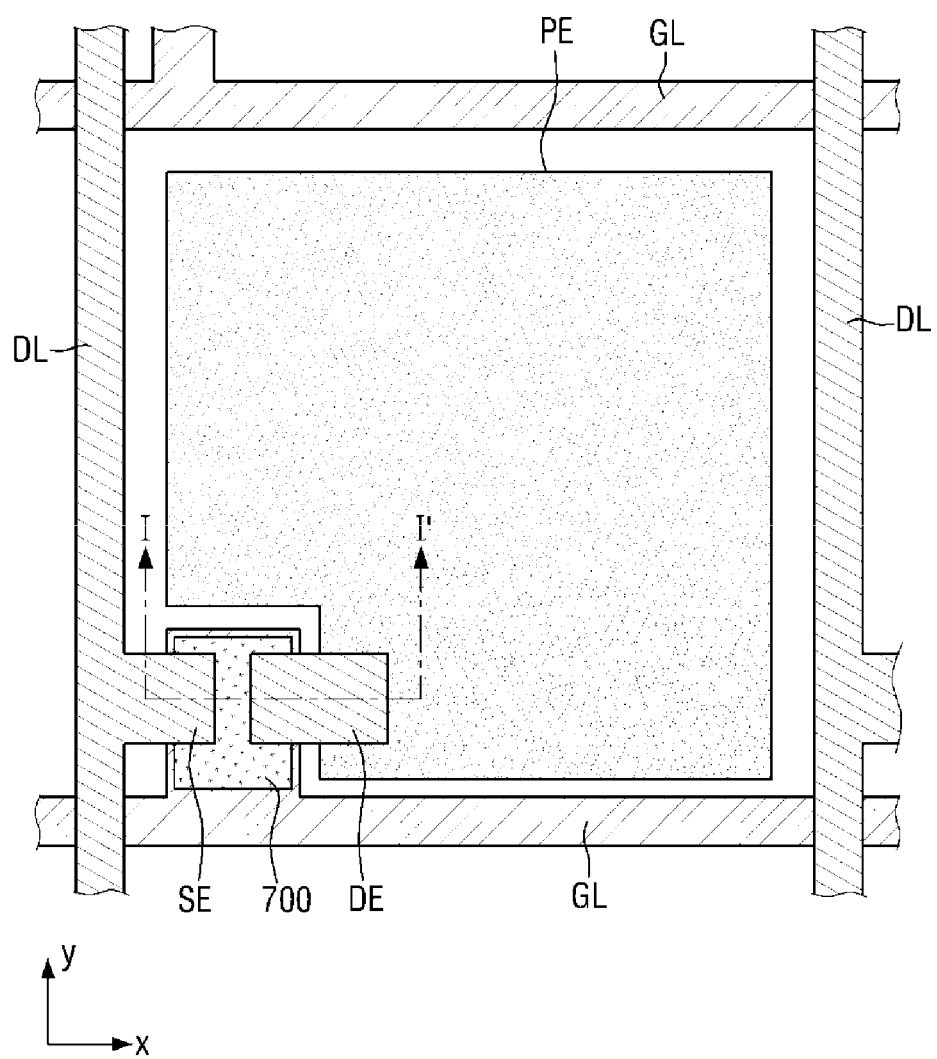
FIG. 2 is an enlarged view of an area A of FIG. 1.
Figure 3:
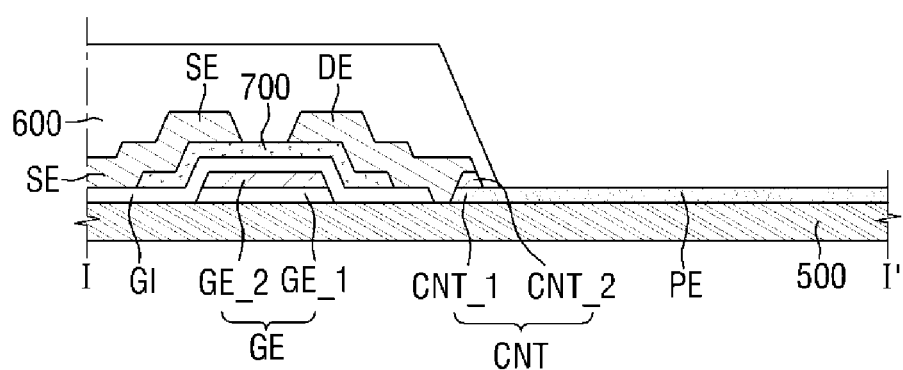
FIG. 3 is a cross-sectional view taken along line I-I' of FIG. 2.
Figure 4:
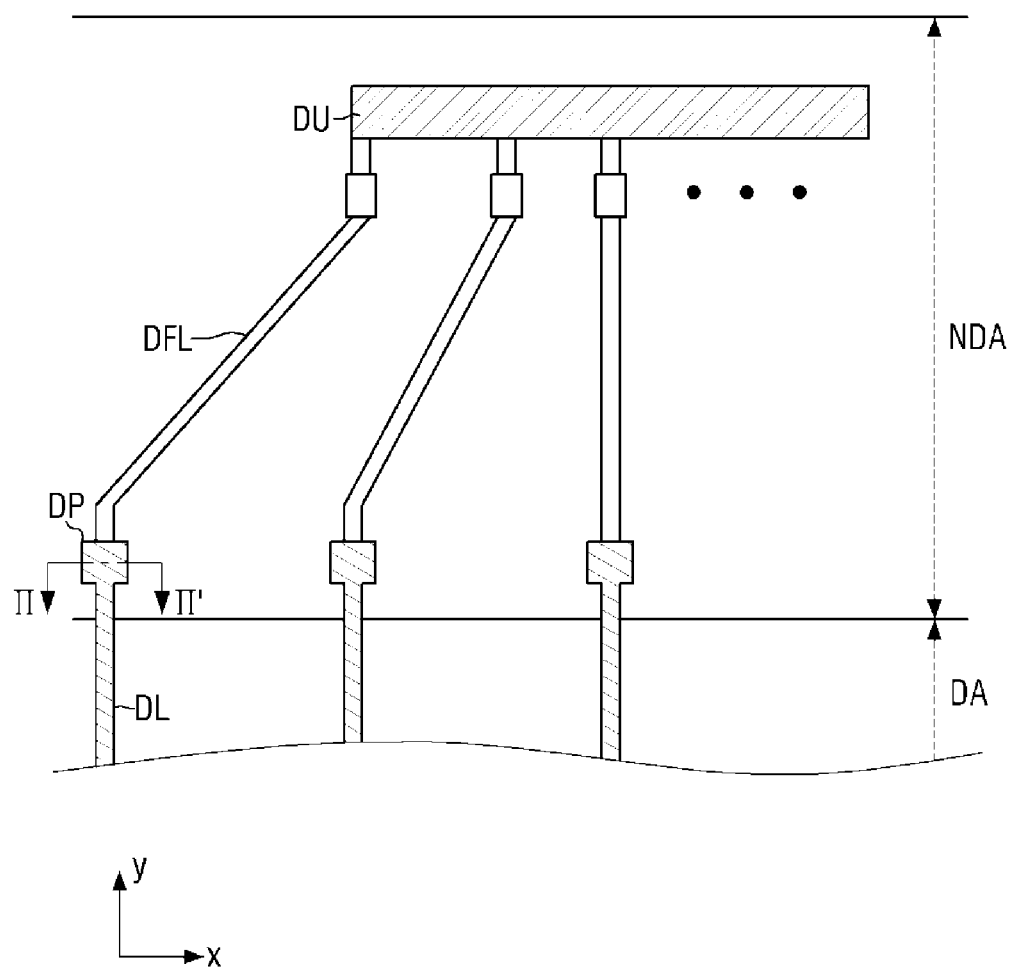
FIG. 4 is an enlarged view of an area B of FIG. 1.
Figure 5:
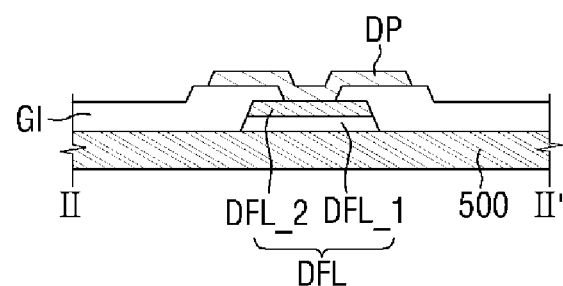
FIG. 5 is a cross-sectional view taken along line II-II' of FIG. 4.

FIG. 1 is a layout view of a liquid crystal display (LCD) device according to an exemplary embodiment of the present disclosure. FIG. 2 is an enlarged view of an area A of FIG. 1. FIG. 3 is a cross-sectional view taken along line I-I' of FIG. 2. FIG. 4 is an enlarged view of an area B of FIG. 1. FIG. 5 is a cross-sectional view taken along line II-II' of FIG. 4.

Referring to FIGS. 1 through 4, the LCD device according to the present exemplary embodiment includes a first substrate 500, which includes a display area DA and a non-display area NDA that is disposed on the outside of the display area DA, a gate electrode GE, which is disposed on the first substrate 500 and includes a first-layer gate electrode GE_1 and a second-layer gate electrode GE_2 that is disposed on the first-layer gate electrode GE_1, a pixel electrode PE, which is disposed on the same layer as the first-layer gate electrode GE, a source electrode SE and a drain electrode DE, which are disposed on the gate electrode GE to be spaced from each other, and a contact CNT, which connects the drain electrode DE and the pixel electrode PE and includes a first-layer contact CNT_1 that is disposed on the same layer as the pixel electrode PE and a second-layer contact CNT_2 that is disposed on the first-layer contact CNT_1.

The first substrate 500 may be formed of a heat-resistant, transparent material. For example, the first substrate 500 may be formed of transparent glass or plastic, but the present disclosure is not limited thereto. The display area DA and the non-display area NDA are defined on the first substrate 500.

The display area DA is an area in which an image is displayed by the LCD device according to the present exemplary embodiment, and the non-display area NDA is an area in which various signal lines are provided for displaying an image in the display area DA.

A plurality of data drivers DU, which provide data signals to a plurality of data lines DL, and a plurality of data fan-out lines DFL, which transmit signals provided by the data drivers DU to the data lines DL, may be disposed in the non-display area NDA.

The display area DA is hereinafter described. A plurality of pixels, which are defined by the data lines DL and a plurality of gate lines GL, which intersect the data lines DL. FIG. 2 illustrates an enlarged view of one of the plurality of pixels (particularly, the area A of FIG. 1), and the display area DA may include a plurality of pixels that are substantially the same as the pixel illustrated in FIG. 2.

The gate electrode GE may be disposed on the first substrate 500. The gate electrode GE and the gate lines GL are hereinafter collectively referred to as gate wiring (GL and GE).

The gate wiring (GL and GE) may comprise at least one of an aluminum (Al)-based metal including an Al alloy, a silver-(Ag)-based metal including an Ag alloy, a copper (Cu)-based metal including a Cu alloy, a molybdenum (Mo)-based metal including a Mo alloy, chromium (Cr), titanium (Ti), and tantalum (Ta), but the material of the gate wiring (GL and GE) is not particularly limited. That is, any metal or polymer material having suitable physical properties for realizing a desired LCD device may be used as the material of the gate wiring (GL and GE).

The gate lines GL receive signals for driving the LCD. The gate lines GL may extend in a first direction, for example, an x-axis direction of FIG. 2.

The gate electrode GE may be formed to protrude from one of the gate lines GL, and may form three terminals of a thin-film transistor (TFT) along with the source electrode SE and the drain electrode DE.

The gate wiring (GL and GE) may have a single-layer structure, but the present disclosure is not limited thereto. That is, alternatively, the gate wiring (GL and GE) may have a double-, triple- or multilayer structure.

FIG. 2 illustrates an example in which the gate wiring (GL and GE) has a double-layer structure. More specifically, the gate electrode GE may include the first-layer gate electrode GE_1, which is disposed on the first substrate 500, and the second-layer gate electrode GE_2, which is disposed on the first-layer gate electrode GE_1.

The first-layer gate electrode GE_1 and the second-layer gate electrode GE_2 may be formed of different materials. For example, the first-layer gate electrode GE_1 may be formed of a transparent conductive material, such as indium tin oxide (ITO) or indium zinc oxide (IZO). Alternatively, the first-layer gate electrode GE_1 may be formed of amorphous ITO.

For example, the second-layer gate electrode GE may be formed of a Cu-based metal.

In each pixel, the pixel electrode PE may be disposed adjacent to the gate electrode GE. The pixel electrode PE may be disposed on the same layer as the gate electrode GE. More specifically, the pixel electrode PE may be disposed on the same layer as the first-layer gate electrode GE_1 and may be formed of substantially the same material as the first-layer gate electrode GE_1. However, the pixel electrode PE and the first-layer gate electrode GE_1 may have different crystalline structures. The pixel electrode PE may be formed of a material comprising a metal and having a polycrystalline structure. For example, in a case in which the first-layer gate electrode GE_1 comprises amorphous ITO, the pixel electrode PE may comprise polycrystalline ITO. This may be due to a manufacturing method of an LCD device according to some exemplary embodiments of the present disclosure, which is described later in detail.

However, the first-layer gate electrode GE_1 and the pixel electrode PE are not limited to comprising amorphous ITO and polycrystalline ITO, respectively. Alternatively, the first-layer gate electrode GE_1 and the pixel electrode PE may both comprise polycrystalline ITO.

FIG. 2 illustrates an example in which the pixel electrode PE is plate-shaped, but the pixel electrode PE is not limited to being plate-shaped. That is, in an alternative exemplary embodiment, the pixel electrode PE may have a structure with one or more slits. In another alternative exemplary embodiment, one or more pixel electrodes PE may be provided, and different voltages may be applied to the pixel electrodes PE.

The contact CNT, which electrically connects the drain electrode DE and the pixel electrode PE, may be disposed at one end of the pixel electrode PE. The contact CNT may include the first-layer contact CNT_1, which is disposed on the same layer as the pixel electrode PE, and the second-layer contact CNT_2, which is disposed on the first-layer contact CNT_1.

The first-layer contact CNT_1 may be disposed on the same layer as the pixel electrode PE and may be formed of substantially the same material as the pixel electrode PE. More specifically, in a case in which the pixel electrode PE comprises polycrystalline ITO, the first-layer contact CNT_1 may also comprise polycrystalline ITO.

The first-layer contact CNT_1 may be formed in one body with the pixel electrode PE may be disposed at one side of the pixel electrode PE.

The second-layer contact CNT_2 may be disposed on the first-layer contact CNT_1. More specifically, the second-layer contact CNT_2 may overlap the first-layer contact CNT_1. A first sidewall of the second-layer contact CNT_2 may be aligned with a first sidewall of the first-layer contact CNT_1.

The second-layer contact CNT_2 may directly contact the drain electrode DE. That is, the pixel electrode PE may be electrically connected to the drain electrode DE via the first-layer contact CNT_1 and the second-layer contact CNT_2.

The second-layer contact CNT_2 may be formed of a different material from the first-layer contact CNT_1. More specifically, the second-layer contact CNT_2 may comprise at least one of an Al-based metal including an Al alloy, an Ag-based metal including an Ag alloy, a Cu-based metal including a Cu alloy, a Mo-based metal including a Mo alloy, Cr, Ti, and Ta.

The second-layer contact CNT_2 may be formed of the same material as the second-layer gate electrode GE_2. More specifically, the second-layer contact CNT_2 may comprise the same material as the second-layer gate electrode GE_2 and may be formed on the same layer as the second-layer gate electrode GE_2. For example, the second-layer gate electrode GE_2 and the second-layer contact CNT_2 may be obtained by patterning a single metal layer using a single mask, but the present disclosure is not limited thereto.

A gate insulating layer GI may be disposed on the first substrate 500 and the gate wiring (GL and GE). The gate insulating layer GI may cover the gate wiring (GL and GE) but may not cover the pixel electrode PE. That is, the top surface of the pixel electrode PE may be at least partially exposed by the gate insulating layer GI.

The gate insulating layer GI may be formed of one or more materials selected from the group consisting of inorganic insulating materials such as silicon oxide (SiOx) and silicon nitride (SiNx) and organic insulating materials such as benzocyclobutene (BCB), an acrylic material, and polyimide (PI) or the mixture thereof, but the present disclosure is not limited thereto. That is, the material of the gate insulating layer GI is not particularly limited.

A semiconductor pattern layer 700 may be disposed on the gate insulating layer GI.

The semiconductor pattern layer 700 may comprise amorphous silicon or polycrystalline silicon, but the present disclosure is not limited thereto. That is, alternatively, the semiconductor pattern layer 700 may comprise an oxide semiconductor.

The semiconductor pattern layer 700 may have various shapes, such as an island shape or a linear shape. In a case in which the semiconductor pattern layer 700 has a linear shape, the semiconductor pattern layer 700 may be provided below a corresponding data line DL and may extend to the top of and overlap the gate electrode GE.

A channel, which electrically connects the source electrode SE and the drain electrode DE, may be formed on the semiconductor pattern layer 700.

An ohmic contact layer (not illustrated) doped with a high concentration of n-type impurities may be disposed on the semiconductor pattern layer 700. The ohmic contact layer may overlap the entire semiconductor pattern layer 700 or part of the semiconductor pattern layer 700. In a case in which the semiconductor pattern layer 700 comprises an oxide semiconductor, the ohmic contact layer may not be provided.

In a case in which the semiconductor pattern layer 700 comprises an oxide semiconductor, the semiconductor pattern layer 700 may comprise zinc oxide (ZnO), and the top of the semiconductor pattern layer 700 may be doped with at least one selected from the group consisting of gallium (Ga) ions, indium (In) ions, tin (Sn) ions, zirconium (Zr) ions, hafnium (Hf) ions, cadmium (Cd) ions, Ag ions, Cu ions, germanium (Ge) ions, gadolinium (Gd) ions, Ti ions, and vanadium (V) ions. For example, the semiconductor pattern layer 700 may comprise at least one oxide semiconductor selected from the group consisting of ZnO, ZnGaO, ZnInO, ZnSnO, GaInZnO, CdO, InO, GaO, SnO, AgO, CuO, GeO, GdO, HfO, TiZnO, InGaZnO, and InTiZnO, but the present disclosure is not limited thereto. That is, the type of the oxide semiconductor of the semiconductor pattern layer 700 is not particularly limited.

A data wiring (DL, SE, and DE) may be disposed on the semiconductor pattern layer 700.

The data wiring (DL, SE, and DE) includes the data lines DL, the source electrode SE, and the drain electrode DE. The data lines DL may extend in a second direction, for example, a Y-axis direction of FIG. 2, and may intersect the gate lines GL.

The source electrode SE may be branched off from one of the data lines DL, may extend to the top of the semiconductor layer 700, and may be disposed to be spaced from, and face, the source electrode SE.

The data wiring (DL, SE, and DE) may have a single- or multilayer structure formed of a metal, such as nickel (Ni), cobalt (Co), Ti, Ag, Cu, Mo, Al, beryllium (Be), Nb, gold (Au), iron (Fe), selenium (Se), or Ta. Also, an alloy of the metal comprising at least one selected from the group consisting of Ti, Zr, tungsten (W), Ta, Nb, platinum (Pt), Hf, oxygen (O), and nitrogen (N) may be applicable to the data wiring (DL, SE, and DE). However, the material of the data wiring (DL, SE, and DE) is not particularly limited.

The drain electrode DE may directly contact the contact CNT. More specifically, the bottom surface of the drain electrode DE may contact the semiconductor pattern layer 700, the gate insulating layer GI, the first substrate 500, and the contact CNT. The drain electrode DE may contact the top surface of the second-layer contact CNT_2. Also, the drain electrode DE may contact the first sidewall of the first-layer contact CNT_1 and the first sidewall of the second-layer contact CNT_2.

A second sidewall of the drain electrode DE may be aligned with a second sidewall of the second-layer contact CNT_2. This may be achieved when the second sidewall of the drain electrode DE and the second sidewall of the second-layer contact CNT_2 are simultaneously etched using a single mask, but the present disclosure is not limited thereto.

A passivation layer 600 may be disposed on the source electrode SE, the semiconductor pattern layer 700, the drain electrode DE, and the pixel electrode PE.

The passivation layer 600, which is a planarization layer, may cover the data lines DL, the source electrode SE, the semiconductor pattern layer 700, and the drain electrode DE and may be formed on the entire surface of the first substrate 500. The passivation layer 600 may be formed of an organic insulating material or an inorganic insulating material. The passivation layer 600 may cover the second sidewall of the drain electrode DE and the second sidewall of the second-layer contact CNT_2. The passivation layer 600 may at least partially expose the pixel electrode PE.

The non-display area NDA is hereinafter described with reference to FIG. 4.

In the non-display area NDA, the data drivers DU, which provide data signals for driving the pixels in the display area, may be disposed. A plurality of data drivers DU may be provided. For example, the plurality of data drivers DU may be arranged along the x-axis direction, but the present disclosure is not limited thereto. That is, the arrangement of the data drivers DU is not particularly limited.

The data drivers DU may provide data signals to the data lines DL via the data fan-out lines DFL. The data drivers DU may be electrically connected to the data fan-out lines DFL. The data fan-out lines DFL may have different lengths, which may compensate for differences in resistance resulting from differences in the distance from the data lines DL to the data fan-out lines DFL. That is, the data fan-out lines DFL may have different lengths to transmit electrically uniform signals to the data lines DL.

First ends of the data fan-out lines DFL may electrically contact data pads DP at the ends of the data lines DL. The data pads DP may be disposed at the ends of the data lines DL and may have a larger width than the data lines DL to facilitate electrical contact between the data lines DL and the data fan-out lines DFL.

The cross-sectional structure of the data fan-out lines DFL is hereinafter described with reference to FIG. 5.

Each of the data fan-out lines DFL may include a first-layer data fan-out line DFL_1 and a second-layer data fan-out line DFL_2. The second-layer data fan-out line DFL_2 may overlap the first-layer data fan-out line DFL_1 and may be disposed on the first-layer data fan-out line DFL_1.

The first-layer data fan-out line DFL_1 may be formed of a transparent conductive material such as ITO or IZO. Alternatively, the first-layer data fan-out line DFL_1 may comprise amorphous ITO.

For example, the first-layer data fan-out line DFL_1 may be formed of substantially the same material as the first-layer gate electrode GE_1 and the pixel electrode PE in the display area DA. In other words, the first-layer data fan-out line DFL_1 may be disposed on the same layer as the first-layer gate electrode GE_1 and the pixel electrode PE in the display area DA. This may be achieved when the first-layer data fan-out line DFL_1, the first-layer gate electrode GE_1 and the pixel electrode PE in the display area DA are formed at the same time using a single mask, but the present disclosure is not limited thereto.

For example, the second-layer data fan-out line DFL_2 may be formed of a Cu-based metal. The second-layer data fan-out line DFL_2 may be formed of substantially the same material as the second-layer gate electrode GE_2 and the second-layer contact CNT_2 in the display area DA. This may be achieved when the second-layer data fan-out line DFL_2, the second-layer gate electrode GE_2 and the second-layer contact CNT_2 in the display area DA are formed at the same time using a single mask, but the present disclosure is not limited thereto.

Sidewalls of the first-layer data fan-out line DFL_1 may be respectively aligned with sidewalls of the second-layer data fan-out line DFL_2.

A gate insulating layer GI may be disposed on the sidewalls of the first-layer data fan-out line DFL_1 and the sidewalls of the second-layer data fan-out line DFL_2. The gate insulating layer GI may be substantially the same as the gate insulating layer GI disposed in the display area DA. For example, the gate insulating layer GI disposed in the display area DA and the gate insulating layer GI disposed in the non-display area NDA may be formed at the same time by a single process.

The gate insulating layer GI in the non-display area NDA may at least partially expose the top surface of the second-layer data fan-out line DFL_2. Part of the top surface of the second-layer data fan-out line DFL_2 that is exposed by the gate insulating layer GI in the non-display area NDA may contact a data pad DP. Accordingly, the data fan-out lines DFL may be electrically connected to the data lines DL. In a case in which the data pads DP and the data fan-out lines DFL are placed in direct contact with each other, no bridges may be needed to connect the data fan-out lines DFL to the data lines DL, and thus, space in the non-display area NDA that would have otherwise been occupied by such bridges is saved. Accordingly, the size of the non-display area may be generally reduced, and as a result, a narrow-bezel LCD device may be realized.

Figure 6:
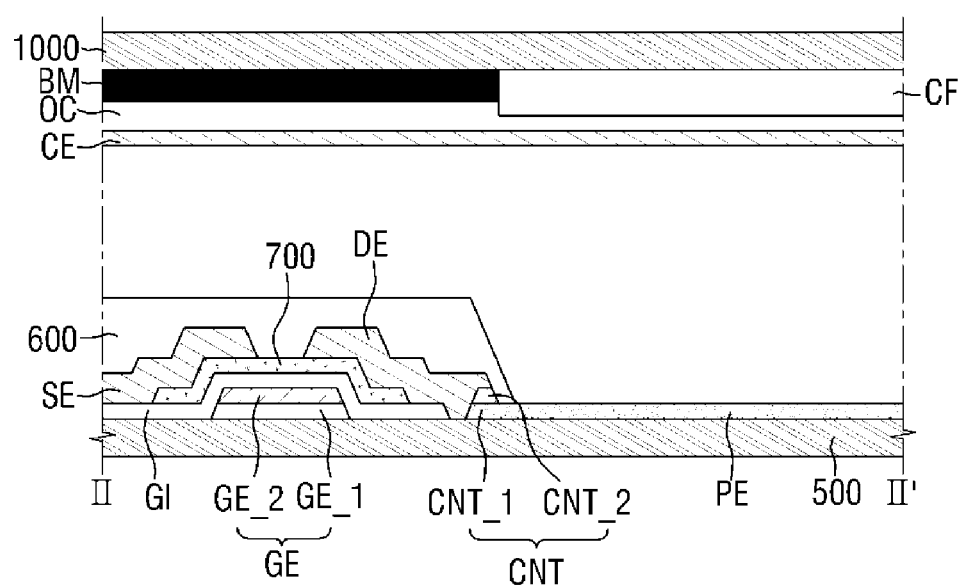
FIG. 6 is a cross-sectional view of an LCD device according to another exemplary embodiment of the present disclosure.

FIG. 6 is a cross-sectional view of an LCD device according to another exemplary embodiment of the present disclosure.

Referring to FIG. 6, the LCD device according to the present exemplary embodiment includes a first substrate 500, which includes a display area DA and a non-display area NDA that is disposed on the outside of the display area DA, a gate electrode GE, which is disposed on the first substrate 500 and includes a first-layer gate electrode GE_1 and a second-layer gate electrode GE_2 that is disposed on the first-layer gate electrode GE_1, a pixel electrode PE, which is disposed on the same layer as the first-layer gate electrode GE, a source electrode SE and a drain electrode DE, which are disposed on the gate electrode GE to be spaced from each other, a contact CNT, which connects the drain electrode DE and the pixel electrode PE and includes a first-layer contact CNT_1 that is disposed on the same layer as the pixel electrode PE and a second-layer contact CNT_2 that is disposed on the first-layer contact CNT_1, and a second substrate 1000, which faces the first substrate 500.

The first substrate 500, the gate electrode GE, the pixel electrode PE, the source electrode SE, the drain electrode DE, and the contact CNT are substantially the same as their respective counterparts of the previous exemplary embodiment, and thus, detailed descriptions thereof are omitted.

The second substrate 1000 may be disposed to face the first substrate 500.

The second substrate 1000 may be formed of a heat-resistant, transparent material. For example, the second substrate 1000 may be formed of transparent glass or plastic, but the present disclosure is not limited thereto.

A black matrix BM and a color filter CF may be disposed on the second substrate 1000. The black matrix BM may suppress light leakage and light interference among the plurality of pixels. The black matrix BM may be disposed to overlap the source electrode SE, the drain electrode DE, and the semiconductor pattern layer 700, which are disposed on the first substrate 500. The black matrix BM may also be disposed to cover the data lines DL and/or the gate lines GL.

The color filter CF may be disposed to overlap the pixel electrode PE. The color filter CF may include at least one selected from the group consisting of a red filter, a blue filter, and a green filter.

An overcoat layer OC may be disposed on the color filter CF and the black matrix BM. The overcoat layer OC may comprise an organic or inorganic insulating material. The overcoat layer OC may be formed on the entire surface of the second substrate 1000 and may serve as a planarization layer.

A common electrode CE may be disposed on the overcoat layer OC. The common electrode CE may be a non-patterned full electrode. A common voltage may be applied to the common electrode CE. In response to different voltages being applied to the common electrode CE and the pixel electrode PE, a predetermined electric field is formed between the common electrode CE and the pixel electrode PE. By using the electric field, the motion of liquid crystal molecules disposed between the first substrate 500 and the second substrate 1000 may be controlled.

A manufacturing method of an LCD device, according to some exemplary embodiments of the present disclosure, is hereinafter described. Some elements that are hereinafter described may be substantially the same as their respective counterparts of an array substrate or an LCD device according to some exemplary embodiments of the present disclosure, and thus, detailed descriptions thereof may be omitted.

FIGS. 7 through 15 are cross-sectional views illustrating a manufacturing method of an LCD device, according to an exemplary embodiment of the present disclosure.

Referring to FIGS. 7 through 15, the manufacturing method according to the present exemplary embodiment includes: preparing a first substrate 500, which includes a display area DA and a non-display area NDA and on which a first metal layer 100 and a second metal layer 200 are sequentially stacked; forming a gate electrode GE, which includes a first-layer gate electrode GE_1 and a second-layer gate electrode GE_2, and a pixel pattern layer PP, which includes a first-layer pixel pattern layer PP_1 and a second-layer pixel pattern layer PP_2, in the display area DA by patterning the first metal layer 100 and the second metal layer 200; forming a gate insulating layer GI on the gate electrode GE and the pixel pattern layer PP; exposing the second-layer pixel pattern layer PP_2 by patterning the gate insulating layer GI; forming a semiconductor pattern layer 700 on the gate electrode GE; changing the crystalline structure of the first-layer pixel pattern layer PP_1 by performing thermal treatment on the resultant structure; and forming a source electrode SE, a drain electrode DE, a pixel electrode PE, and a contact CNT, which allows electrical connection between the source electrode SE, the drain electrode DE, and the pixel electrode PE (for example, when the TFT is switched on), in the display area DA by forming a third metal layer 300 on the resultant structure and etching both the second-layer pixel pattern layer PP_2 and the third metal layer 300 using a single mask.

Figure 7:
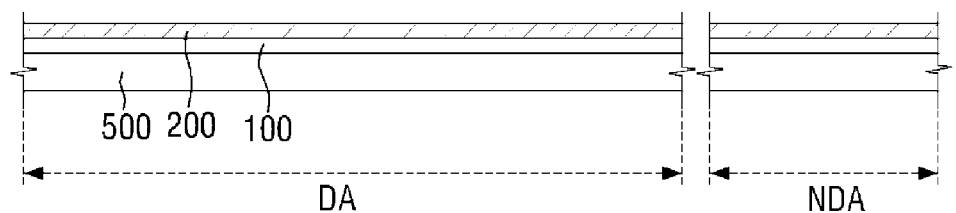
FIGS. 7, 8, 9, 10, 11, 12, 13, 14 and 15 are cross-sectional views illustrating a manufacturing device of an LCD device, according to an exemplary embodiment of the present disclosure.

Referring to FIG. 7, the first substrate 500, which includes the display area DA and the non-display area NDA and on which the first metal layer 100 and the second metal layer 200 are sequentially stacked, is prepared.

The first metal layer 100 may be formed on the entire surface of the first substrate 500 in and across the display area DA and the non-display area NDA. For example, the first metal layer 100 may comprise a transparent conductive material such as ITO or IZO. Alternatively, the first metal layer 100 may comprise amorphous ITO. As noted by the above examples, the first metal layer is not necessarily formed wholly of metal.

For example, the first metal layer 100 may be formed by chemical vapor deposition (CVD) or sputtering.

The first metal layer 100 may be patterned later to form the first-layer gate electrode GE_1, the pixel electrode PE, and a first-layer contact CNT_1 in the display area DA. Also, the first metal layer 100 may be patterned later to form a first-layer data fan-out line DFL_1 in the non-display area NDA.

The second metal layer 200 may be formed on the entire surface of the first substrate 500 in and across the display area DA and the non-display area NDA. For example, the second metal layer 200 may be formed of a Cu-based metal.

For example, the second metal layer 200 may be formed by CVD or sputtering.

The second metal layer 200 may be patterned later to form the second-layer gate electrode GE_2 and a second-layer contact CNT_2 in the display area DA. Also, the second metal layer 200 may be patterned later to form a second-layer data fan-out line DFL_2 in the non-display area NDA.

Figure 8:
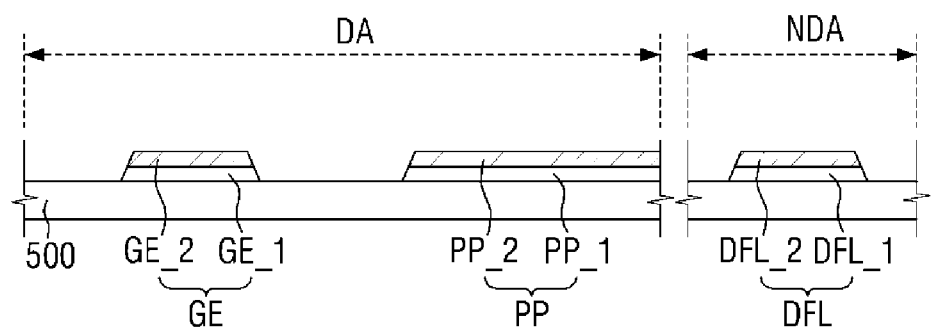

Thereafter, referring to FIG. 8, the gate electrode GE, which includes the first-layer gate electrode GE_1 and the second-layer gate electrode GE_2, and the pixel pattern layer PP, which includes the first-layer pixel pattern layer PP_1 and the second-layer pixel pattern layer PP_2, are formed in the display area DA by patterning the first metal layer 100 and the second metal layer 200.

The first-layer gate electrode GE_1 and the second-layer gate electrode GE_1 are substantially the same as their respective counterparts of the LCD devices according to some exemplary embodiments of the present disclosure, and thus, detailed descriptions thereof are omitted.

The first-layer pixel pattern layer PP_1 may be patterned later to form the pixel electrode PE and the first-layer contact CNT_1 in the display area DA.

The second-layer pixel pattern layer PP_2 may be patterned later to form the second-layer contact CNT_2 in the display area DA.

The forming of the gate electrode GE, which includes the first-layer gate electrode GE_1 and the second-layer gate electrode GE_2, and the pixel pattern layer PP, which includes the first-layer pixel pattern layer PP_1 and the second-layer pixel pattern layer PP_2, in the display area DA by patterning the first metal layer 100 and the second metal layer may include forming the first-layer data fan-out line DFL_1 and the second-layer data fan-out line DFL_2 in the non-display area NDA by patterning the first metal layer 100 and the second metal layer 200.

The forming of the gate electrode GE, which includes the first-layer gate electrode GE_1 and the second-layer gate electrode GE_2, and the pixel pattern layer PP, which includes the first-layer pixel pattern layer PP_1 and the second-layer pixel pattern layer PP_2, in the display area DA by patterning the first metal layer 100 and the second metal layer and the forming of the first-layer data fan-out line DFL_1 and the second-layer data fan-out line DFL_2 in the non-display area NDA by patterning the first metal layer 100 and the second metal layer 200 may be performed substantially simultaneously, but the present disclosure is not limited thereto. That is, the forming of the gate electrode GE, which includes the first-layer gate electrode GE_1 and the second-layer gate electrode GE_2, and the pixel pattern layer PP, which includes the first-layer pixel pattern layer PP_1 and the second-layer pixel pattern layer PP_2, in the display area DA by patterning the first metal layer 100 and the second metal layer and the forming of the first-layer data fan-out line DFL_1 and the second-layer data fan-out line DFL_2 in the non-display area NDA by patterning the first metal layer 100 and the second metal layer 200 may be performed sequentially or independently as separate processes.

Figure 9:
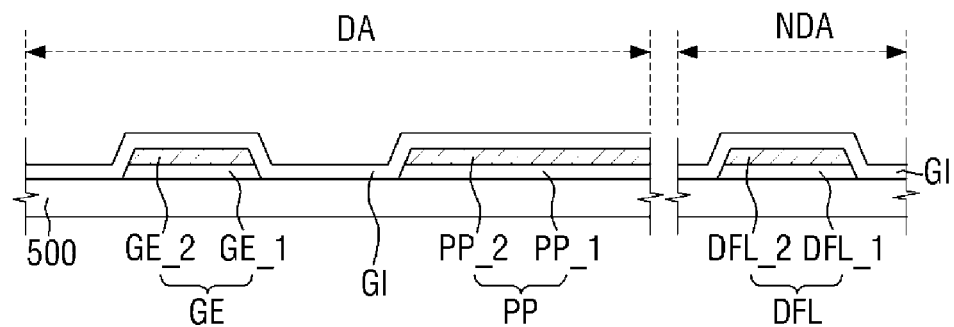

Thereafter, referring to FIG. 9, the gate insulating layer GI is formed on the gate electrode GE and the pixel pattern layer PP.

The gate insluting layer GI may be substantially the same as its counterpart of the LCD devices according to some exemplary embodiments of the present disclosure. The gate insulating layer GI may be formed in and across the display area DA and the non-display area NDA. More specifically, the gate insulating layer GI may cover the gate electrode GE, the pixel pattern layer PP, and a data fan-out line DFL.

Figure 10:
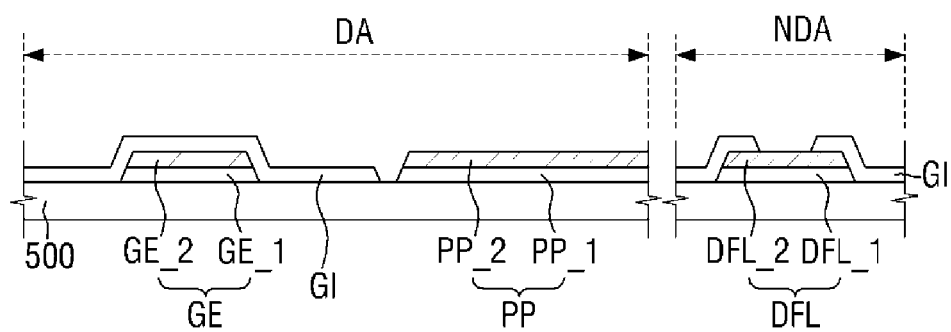

Thereafter, referring to FIG. 10, the second-layer pixel pattern layer PP_2 is exposed by patterning the gate insulating layer GI.

For example, the gate insulating layer GI may be patterned by photolithography.

The exposing of the second-layer pixel pattern layer PP_2 by patterning the gate insulating layer GI may include at least partially exposing the second-layer data fan-out line DFL_2 in the non-display area NDA by patterning the gate insulating layer GI.

The exposing of the second-layer pixel pattern layer PP_2 by patterning the gate insulating layer GI and the at least partially exposing of the second-layer data fan-out line DFL_2 in the non-display area NDA by patterning the gate insulating layer GI may be performed substantially simultaneously, but the present disclosure is not limited thereto. That is, the exposing of the second-layer pixel pattern layer PP_2 by patterning the gate insulating layer GI and the at least partially exposing of the second-layer data fan-out line DFL_2 in the non-display area NDA by patterning the gate insulating layer GI may be performed sequentially or independently as separate processes.

Figure 11:
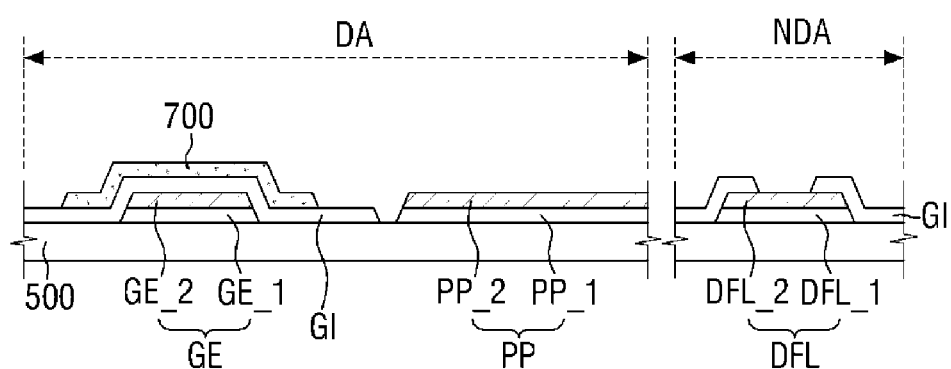

Thereafter, referring to FIG. 11, the semiconductor pattern layer 700 is formed on the gate electrode GE. More specifically, the semiconductor pattern layer 700 may be formed on the gate insulating layer GI to at least partially overlap the gate electrode GE.

For example, the semiconductor pattern layer 700 may be formed by forming and patterning a semiconductor layer. More specifically, the semiconductor layer may be etched and then be patterned through wet or dry etching using a photosensitive layer pattern.

Figure 12:
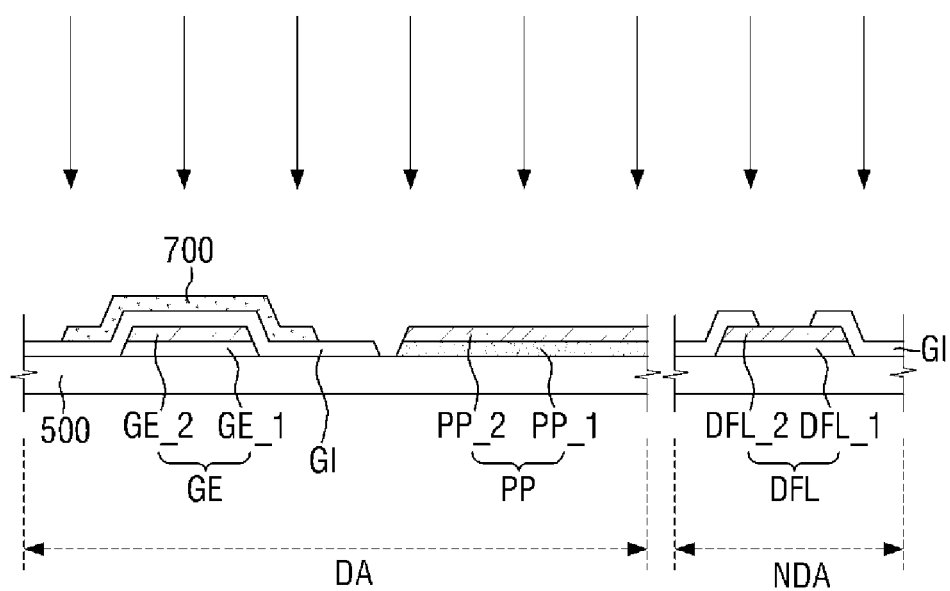

Thereafter, referring to FIG. 12, the crystalline structure of the first-layer pixel pattern layer PP_1 is changed by performing thermal treatment on the resultant structure.

The crystalline structure of the first-layer pixel pattern layer PP_1 may be changed by performing thermal treatment. More specifically, the first pixel pattern layer PP_1 may be transformed from an amorphous structure to a polycrystalline structure. In a case in which the first pixel pattern layer PP_1 is formed of amorphous ITO, the amorphous ITO of the first pixel pattern layer PP_1 may be transformed into polycrystalline ITO by performing a thermal treatment process. As a result of the thermal treatment process, the crystalline structure of the first-layer gate electrode GE_1 and the first-layer data fan-out line DFL_1 in the non-display area NDA may also be changed. That is, in a case in which the first-layer gate electrode GE_1 and the first-layer data fan-out line DFL_1 in the non-display area NDA are formed of amorphous ITO, the amorphous ITO of the first-layer gate electrode GE_1 and the first-layer data fan-out line DFL_1 in the non-display area NDA may be transformed into polycrystalline ITO by the thermal treatment process. Alternatively, the first pixel pattern layer PP_1 may be formed of polycrystalline ITO, and the first-layer gate electrode GE_1 and the first-layer data fan-out line DFL_1 in the non-display area NDA may be formed of amorphous ITO.

Figure 13:
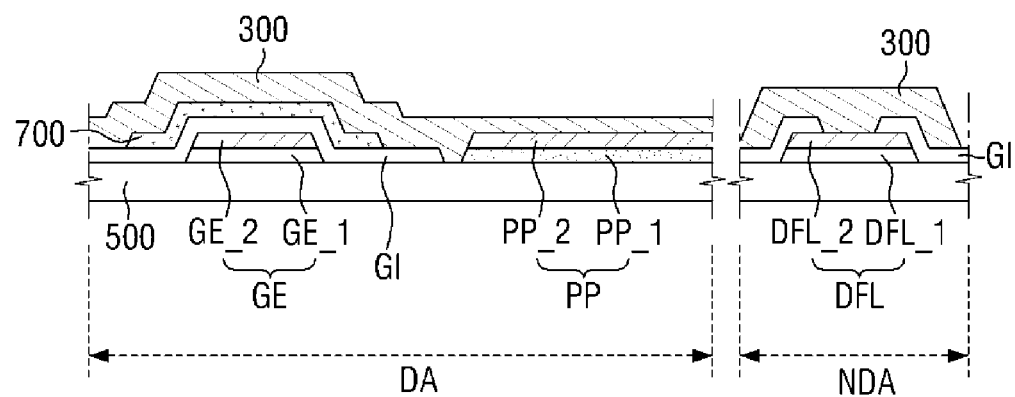
Figure 14:
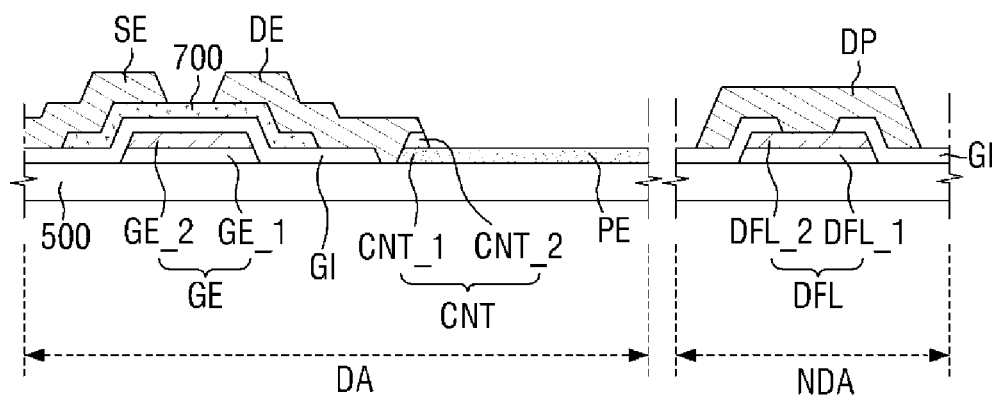

Thereafter, referring to FIGS. 13 and 14, the third metal layer 300 is formed on the resultant structure, and the source electrode SE, the drain electrode DE, the pixel electrode PE, and the contact CNT, which electrically connects the source electrode SE, the drain electrode DE, the pixel electrode PE, are formed in the display area DA by etching both the second-layer pixel pattern layer PP_2 and the third metal layer 300 using a single mask.

The third metal layer 300 may be formed on the entire surface of the first substrate 500 in and across the display area DA and the non-display area NDA. For example, the third metal layer 300 may have a single- or multilayer structure formed of a metal such as Ni, Co, Ti, Ag, Cu, Mo, Al, Be, Nb, Au, Fe, Se, or Ta. Also, an alloy of the metal comprising at least one selected from the group consisting of Ti, Zr, W, Ta, Nb, Pt, Hf, O, and N may be applicable to the third metal layer 300.

For example, the third metal layer 300 may be formed by CVD or sputtering.

The third metal layer 300 may be patterned later to form the source electrode SE, the drain electrode DE, and a data line DL in the display area DA. Also, the third metal layer 300 may be patterned later to form a data pad DP in the non-display area NDA.

Thereafter, the third metal layer 300 and the second-layer pixel pattern layer PP_2 may both be etched using a single mask. For example, the third metal layer 300 and the second-layer pixel pattern layer PP_2 may both be etched using the same mask and the same etchant. In this example, the first-layer pixel pattern layer PP_1 may remain unetched and may thus form the pixel electrode PE.

Part of the second-layer pixel pattern layer PP_2 that is overlapped by the drain electrode DE may remain unetched due to the presence of the drain electrode DE. The remaining part of the second-layer pixel pattern layer PP_2 may form the second-layer contact CNT_2. The second-layer contact CNT_2 accounts for part of the second-layer pixel pattern layer PP_2 that remains unetched due to a mask for forming the drain electrode DE. Accordingly, a second sidewall of the second-layer contact CNT_2 and a second sidewall of the drain electrode DE may be aligned with each other.

Part of the first-layer pixel pattern layer PP_1 that is overlapped by the second-layer contact CNT_2 may form the first-layer contact CNT_1. That is, the first-layer pixel pattern layer PP_1 may remain unetched to form the first-layer contact CNT_1 and the pixel electrode PE.

Consequently, by etching both the third metal layer 300 and the second-layer pixel pattern layer PP_2 using a single mask, the source electrode SE, the drain electrode DE, the data line DL, the pixel electrode PE, and the contact CNT are formed in the display area DA, and the data pad DP is formed in the non-display area NDA.

Since the source electrode SE, the drain electrode DE, the data line DL, the pixel electrode PE, and the contact CNT are formed in the display area DA and at the same time, the data pad DP is formed in the non-display area NDA without a requirement of additional mask processes, the number of masks required may be reduced, and thus, the manufacturing cost of an LCD device may be reduced.

Figure 15:
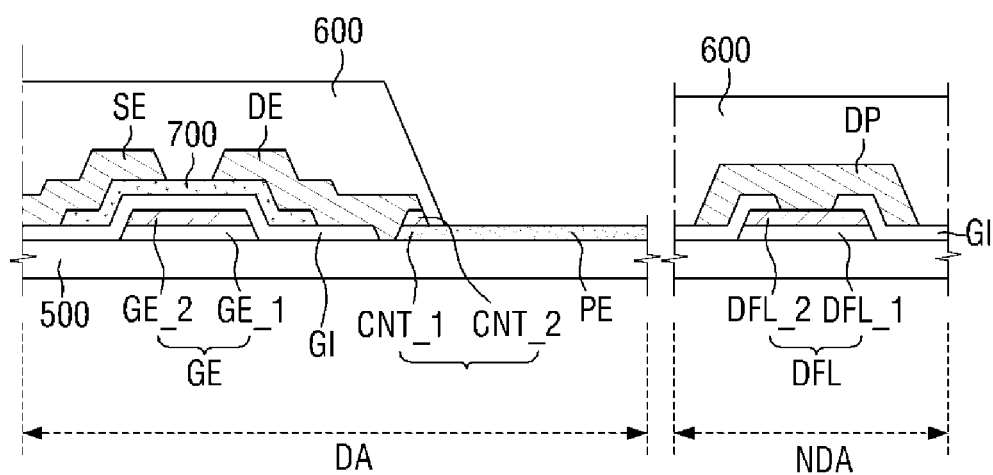

Thereafter, referring to FIG. 15, a passivation layer 600 is formed on the resultant structure. The passivation layer 600 may be substantially the same as its counterpart of the LCD devices according to some exemplary embodiments of the present disclosure, and thus, a detailed description thereof is omitted.

However, the effects of the present invention are not restricted to the one set forth herein. The above and other effects of the present invention will become more apparent to one of daily skill in the art to which the present invention pertains by referencing the claims.

While the present invention has been particularly illustrated and described with reference to exemplary embodiments thereof, it will be understood by those of ordinary skill in the art that various changes in form and detail may be made therein without departing from the spirit and scope of the present invention as defined by the following claims. The exemplary embodiments should be considered in a descriptive sense only and not for purposes of limitation.

What is claimed is:

1. A liquid crystal display (LCD) device, comprising:
a first substrate including a display area and a non-display area disposed outside of the display area;
a gate electrode disposed on the first substrate and including a first-layer gate electrode and a second-layer gate electrode disposed on the first-layer gate electrode;
a pixel electrode disposed on the same layer as the first-layer gate electrode;
a source electrode and a drain electrode disposed on the gate electrode to be spaced from each other; and
a contact connecting the drain electrode and the pixel electrode and including a first-layer contact, which is disposed on the same layer as the pixel electrode, and a second-layer contact, which is disposed on the first-layer contact,
wherein the contact is disposed between the drain electrode and the first substrate,
wherein the first-layer gate electrode is disposed between the first substrate and the second-layer gate electrode,
wherein the first-layer contact is disposed between the first substrate and the second-layer contact,
wherein the first-layer gate electrode, the first-layer contact and the pixel electrode are made of the same transparent conductive material,
wherein the second-layer gate electrode and the second-layer contact are made of the same metal, and
wherein the first-layer contact and the second-layer contact are made of different materials.

2. The LCD device of claim 1, wherein the first-layer contact is formed in one body with the pixel electrode.

3. The LCD device of claim 1, wherein a first sidewall of the first-layer contact is aligned with a first sidewall of the second-layer contact.

4. The LCD device of claim 1, further comprising a semiconductor pattern layer;

wherein the semiconductor pattern layer comprises an oxide semiconductor.

5. The LCD device of claim 1, wherein the second-layer contact comprises a first sidewall and a second sidewall opposing the first sidewall, and
wherein the first sidewall is in contact with the drain electrode and the second sidewall is aligned with an edge of the drain electrode.

6. The LCD device of claim 1, further comprising:
a data fan-out line disposed in the non-display area and including a first-layer data fan-out line and a second-layer data fan-out line disposed on the first-layer data fan-out line.

7. The LCD device of claim 6, further comprising:
a data line connected to the source electrode and a data pad disposed at an end of the data line,
wherein the data pad contacts the second-layer data fan-out line.

8. An LCD device, comprising:
a first substrate including a display area and a non-display area disposed outside of the display area;
a gate electrode disposed on the first substrate and including a first-layer gate electrode and a second-layer gate electrode disposed on the first-layer gate electrode;
a pixel electrode disposed on the same layer as the first-layer gate electrode;
a source electrode and a drain electrode disposed on the gate electrode to be spaced from each other;
a contact connecting the drain electrode and the pixel electrode and including a first-layer contact and a second-layer contact, which is disposed on the first-layer contact; and
a second substrate facing the first substrate,
wherein the contact is disposed between the drain electrode and the first substrate,
wherein the first-layer gate electrode is disposed between the first substrate and the second-layer gate electrode,
wherein the first-layer contact is disposed between the first substrate and the second-layer contact,
wherein the first-layer gate electrode, the first-layer contact and the pixel electrode are made of the same transparent conductive material,
wherein the second-layer gate electrode and the second-layer contact are made of the same metal, and
wherein the first-layer contact and the second-layer contact are made of different materials.

9. The LCD device of claim 8, wherein the second-layer contact comprises a first sidewall and a second sidewall opposing the first sidewall, and
wherein the first sidewall is in contact with the drain electrode and the second sidewall is aligned with an edge of the drain electrode.

10. The LCD device of claim 8, wherein the second-layer contact has a first portion which is only disposed along an edge of the first-layer contact which overlaps with the drain electrode.

11. The LCD device of claim 8, further comprising:
a color filter disposed on the second substrate and overlapping the pixel electrode; and
a black matrix overlapping the source electrode and the drain electrode.

12. The LCD device of claim 11, further comprising:
a common electrode disposed on the color filter and the black matrix.

* * * * *